United States Patent [19]

Nabell et al.

[11] Patent Number: 4,703,983
[45] Date of Patent: Nov. 3, 1987

[54] APPARATUS FOR GROUNDING AN ELECTRONIC MODULE COUPLED TO A TERMINAL CONNECTING BLOCK

[75] Inventors: Robert E. Nabell, Ocala; William F. C. Wrighton, Gainesville, both of Fla.

[73] Assignee: Edco, Inc., Ocala, Fla.

[21] Appl. No.: 827,756

[22] Filed: Feb. 7, 1986

[51] Int. Cl.⁴ .......................................... H01R 13/652
[52] U.S. Cl. ...................................... 439/92; 439/709; 439/834
[58] Field of Search ................. 339/14 R, 14 L, 14 P, 339/17 C, 97 P, 198 P, 198 N, 252 P

[56] References Cited

U.S. PATENT DOCUMENTS

| | | | |
|---|---|---|---|
| 1,941,905 | 1/1934 | Mair | 339/14 L |
| 3,176,256 | 3/1965 | Turinsky | 339/252 P |
| 3,533,044 | 10/1970 | Bauman et al. | 339/14 P |
| 3,673,542 | 6/1972 | DiStefano et al. | 339/14 R |
| 4,082,393 | 4/1978 | Gamble | 339/14 R |
| 4,085,988 | 4/1978 | Gamble | 339/14 R |
| 4,113,340 | 9/1978 | Rapata | 339/97 P |
| 4,281,885 | 8/1981 | Forberg et al. | 339/14 R |
| 4,556,275 | 12/1985 | Hamsher, Jr. | 339/14 R |

Primary Examiner—John McQuade
Attorney, Agent, or Firm—Duckworth, Allen & Dyer

[57] ABSTRACT

An apparatus and method for grounding an electronic module which is electrically interconnected with a terminal connecting block. The electronic module has a pin receiving port for electrically connecting a conductive pin thereto. A clip having a two-pronged clasp and a protruding conductive pin is attached to the electronic module with the protruding pin of the clip placed within the pin receiving port. A flat conductive strip is placed within the two-pronged clasp of the clip, wherein the clip electrically couples the electronic module with the conductive strap. The conductive strap is then electrically coupled to ground.

8 Claims, 9 Drawing Figures

U.S. Patent  Nov. 3, 1987  Sheet 1 of 3  4,703,983
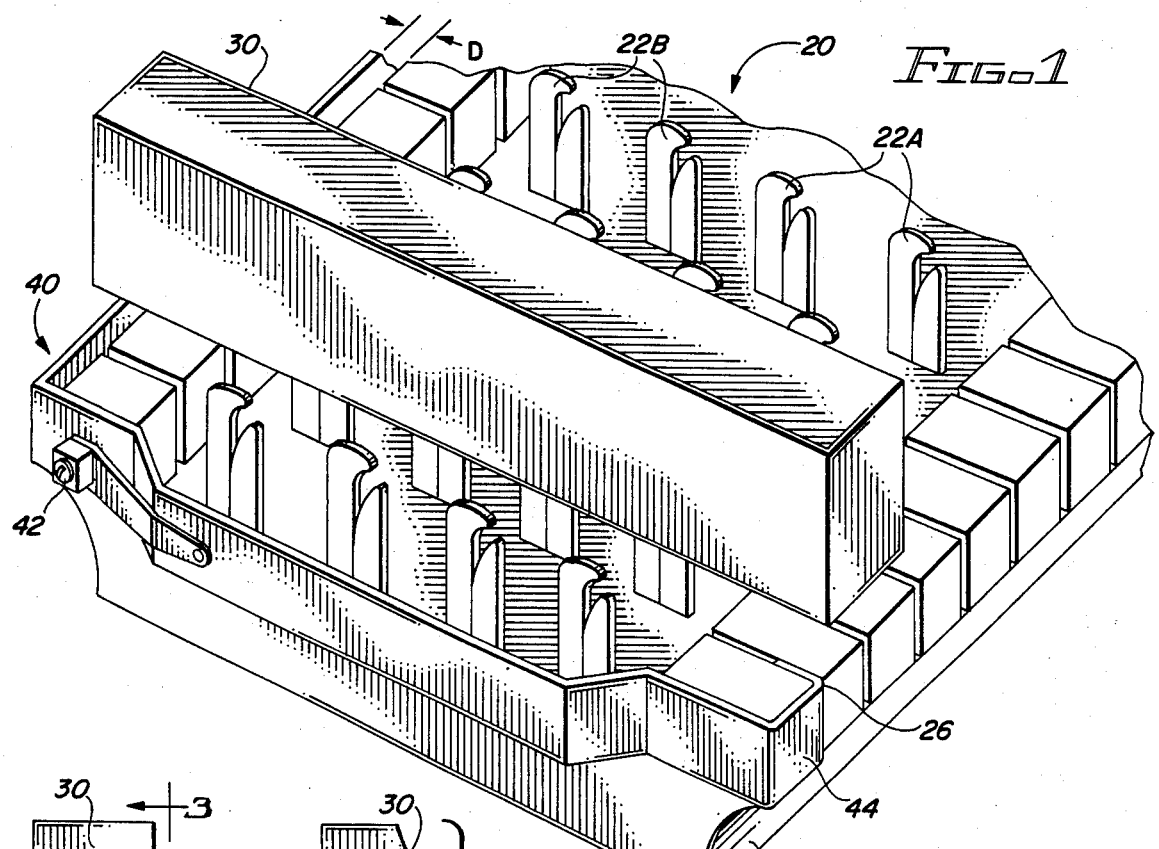
FIG. 1
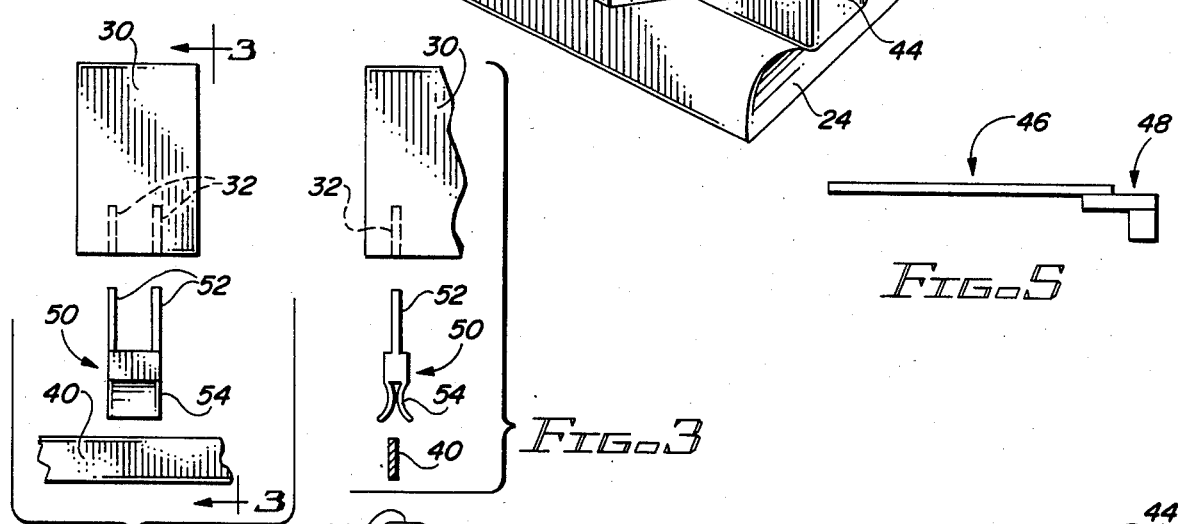
FIG. 2
FIG. 3
FIG. 4
FIG. 5

APPARATUS FOR GROUNDING AN ELECTRONIC MODULE COUPLED TO A TERMINAL CONNECTING BLOCK

BACKGROUND OF THE INVENTION

This invention relates to a method and apparatus for electronically interconnecting a terminal connecting block and an electronic module and, more particularly, to an integral ground strap arrangement and quick connect apparatus for effecting such interconnection.

Terminal connecting blocks are used extensively in the communication industry. For example, they are used in the telephone industry on distribution panels to interconnect conductors in a central office cable to conductors from the various station equipment located within a building. One type of connecting block is disclosed in U.S. Pat. No. 3,234,498 issued to A. Logan on Feb. 8, 1966. This connector block consists of a plurality of split blade-like metallic terminals arranged side-by-side in rows forming a rectangular array of terminals mounted in an electrical insulating block. The terminals are of the insulation-penetrating clip-type which penetrates the insulation and tightly clamps the conductor when a wire is inserted therein. The terminals are blade-like and are arranged side-by-side in rows so that faces of the terminals lie in a horizontal plane. Such phone terminal connector blocks are designated in one form as type M-66.

Frequently, it is desirble to add an electrical component, or module, across the terminals of a connecting block to protect the connected equipment or to compensate for unusual line characteristics. These modules usually need to be connected to electric ground. Typically, each module is provided with a ground wire, commonly referred to as a pigtail, which protrudes from the module. Each pigtail must individually be attached to ground. Attachment of the ground wire usually constitutes the greatest portion of time required for connecting each module. Additionally, if many modules are coupled to the terminal connecting block and need to be connected to ground, the ground wires from the modules become strewn about to resemble a "bird's nest". Another type of grounding technique utilizes a screw terminal on each module to permit direct connection to a ground strap having corresponding apertures for receiving a screw. Although this technique avoids wiring problems, it still requires additional labor to align and install screw connections.

Accordingly, it is an object of the invention to provide a method and apparatus for connecting a module to ground without the need of ground wires.

It is another object of the present invention to provide a method and apparatus for grounding a module quickly and easily.

It is a still further object of the invention to provide a method and apparatus for easily assembling a module to a terminal connection block.

SUMMARY OF THE INVENTION

The present invention teaches a method and apparatus for electrically grounding and connecting an electrical module to a terminal connection block. The connection block has a plurality of terminals for allowing electric interconnections between a plurality of input electric lines and a corresponding plurality of output electric lines. The inventive apparatus includes a unique method and apparatus for automatically grounding an electronic module and for connecting the module to the connection block. A conductive strap is mechanically attached to the connecting block and has at least one section running parallel to the block in spaced apart relationship. The parallel section is oriented in a vertical plane with its upper edge being aligned in a horizontal plane passing through the tips of the terminals of the connection block. The electronic module is provided with a plurality of electrically conductive spring clips positioned so as to mate with the connection block terminals and the ground strap when the module is properly oriented. By positioning the module over the block and pressing down, the clips will slip onto and grasp the terminals and ground strap thus being electrically and mechanically connected to the terminals and strap.

The electronic module comprises an electric circuit having an input terminal, output terminal and ground terminal. Each of the terminals is electrically connected to a corresponding one of the spring clips. The electric circuit of the electronic module is thereby coupled to electrical equipment connected to the terminal connecting block.

The spring clips are uniquely designed to fit over and grasp the terminals and strap in friction engagement. Each of the clips is provided with a pair of extending pins or legs which protrude oppositely from the direction of the grasping portion. The pins are dimensioned for insertion into standard hole sizes in a printed circuit board and are of a material which allows solder connection to electrical "runs" on the board. The pair of pins facilitate assembly by assuring proper orientation of the clips when assembled to a module. The length of the pins is such that the pins protrude a significant distance above the board surface such that when the board is placed in a potting compound, the pins act as anchors to hold the board and its components to the compound.

BRIEF DESCRIPTION OF THE DRAWINGS

The foregoing and other objects, features and advantages of the invention will become more apparent by reference to the accompanying drawings and the following detailed description taken in conjunction with the drawings in which:

FIG. 1 illustrates a perspective view of an electronic module interconnected with a terminal connection block in accordance with the present invention;

FIG. 2 illustrates an exploded end view of an electric module connected to a conductive strap in accordance with the present invention;

FIG. 3 illustrates a section view 3-3 of FIG. 2;

FIG. 4 is a top view of one form of conductive strap in accordance with the present invention;

FIG. 5 illustrates another embodiment of a conductive strap;

DETAILED DESCRIPTION

Figure 6:
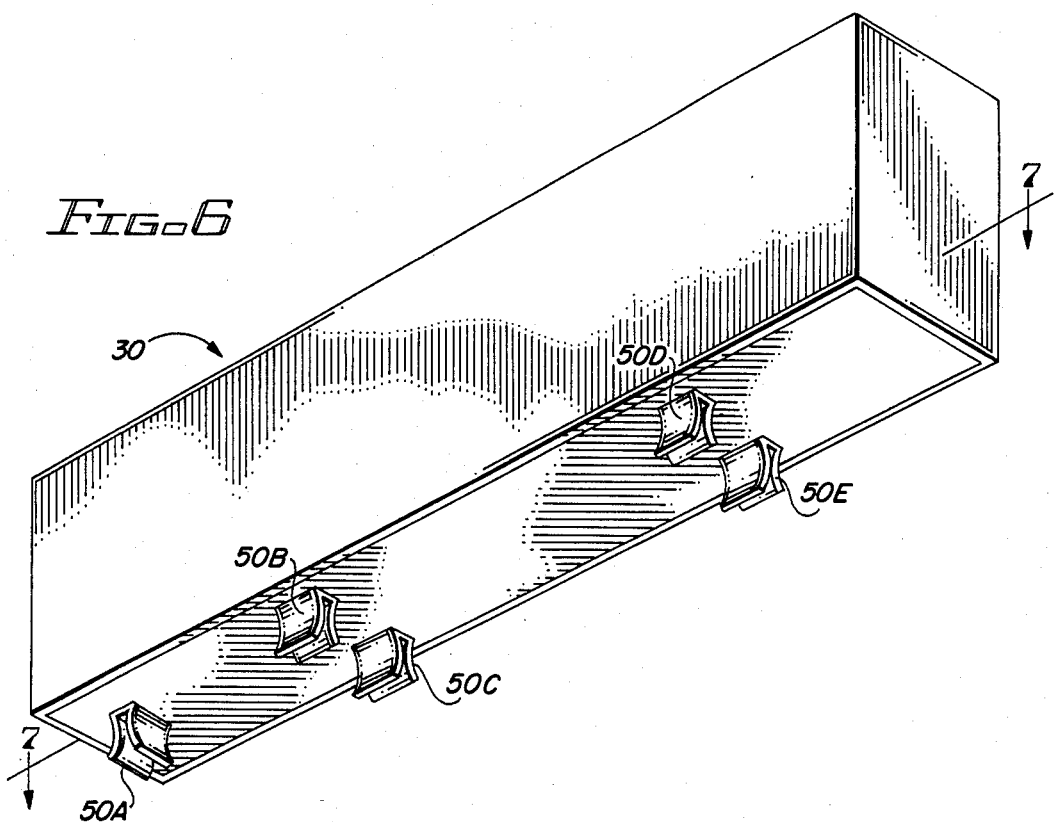
FIG. 6 illustrates a bottom perspective view of an electronic module in accordance with the present invention.

FIG. 1 illustrates a perspective view of an electronic module 30 connected to a terminal connecting block 20 in accordance with a preferred embodiment of the present invention. The terminal connecting block 20, well known in the art, has a plurality of split blade-like metallic terminals 22 arranged side-by-side in rows forming a rectangular array of terminals 22 mounted in an electrical insulating base 24. The terminals 22 are of the insulationpenetrating clip-type which penetrates insulation from conductors and tightly clamps conductors when a wire is inserted into the split. Four terminals 22 are typically in a row. Each row consists of two adjacent pairs of terminals 22a and 22B with both of the terminals 22 in each pair being electrically connected together within the block base 24. Although not visible in FIG. 1, one terminal of each pair of terminals 22 in two adjacent rows is connected to corresponding electrical clips on electronic module 30. Two of the terminals 22B connected to the module 30 may act as input connections and two other terminals 22A may act as output connections for an electric circuit within the module. Frequently, the circuit within the module 30 requires an electric ground. To accommodate this, a conductive strap 40 is mechanically attached to the terminal connecting block 20 in spaced apart relationship by a distance D such that a clip (not visible) may also connect the module 30 to the strap 40.

FIGS. 2 and 3 illustrate the connection of the electronic module 30 to the ground strap 40. The electronic module 30 has two pin receiving ports 32 which are electrically coupled to a lead requiring electrical ground. The electric module 30 is electrically connected to the conductive strap 40 by way of a conductive clip 50. The conductive clip 50 has two pins 52 dimensioned for insertion into the pin receiving ports 32. A two-pronged clasp 54 on the clip 50 sandwiches the conductive strap 40. Thus, the clip 50 electrically couples the electric module 30 to the conductive strap 40. The clip 50 is one of a plurality of clips for connecting the module 30 to the block 20. The pins 52 are inserted through the ports 32 and soldered to electrical runs on a printed circuit board. The pair of pins 52 assure proper orientation of the clip 50 with respect to the strap 40. As shown in FIG. 3, the clasp 54 must be positioned to slip onto and grasp the strap 40 to assure good electrical connection.

Referring again to FIG. 1, a compression lug 42 is connected to the conductive strap 40. A wire or other conductor (not shown) is attached at one end to the lug 42 and attached at its other end to an established electrical ground. Thus, the conductive strap 40 is electrically coupled to ground. The present invention is capable of providing electrical ground to many electronic modules connected on the block 20 without the need of undesirable ground wires and without having to individually provide screw connections to the modules.

Reference is now made to FIG. 4 in conjunction with FIG. 1 to illustrate the shape of the conductive strap 40. Preferably, the strap 40 wraps around three sides of the terminal connection block 20. The strap compresses against ends of the connection block 20 to frictionally support itself thereon. Additionally, the ends 44 are looped to hook into slots 26 at ends of the connection block 20.

The metallic strap 40 has sufficient spring tension to support itself on block 20. FIG. 5 illustrates another embodiment of a conductive strap 46 for use where only a few modules 30 are to be positioned on a block 20. Due to the frictional force of the clasp 54 of FIGS. 2 and 3, the conductive strap 46 need not be supported by the connecting block 20. This short conductive strap 46 is ideal for use in grounding only one or a few electric modules. The conductive strap 46 is also provided with a compression lug 48 for attachment of a conductor wire.

FIG. 6 is a lower perspective view of the electric module 30 showing the positioning of clips 50. The module 30 typically requires five clips 50A, 50B, 50C, 50D and 50E which sandwich corresponding terminals on the connecting block 20 and the ground strap 40. The module 30 shown in FIG. 6 requires the use of terminals in two adjacent rows of the connecting block. Although only one pin receiving port is needed for connecting the module 30 to ground, the use of two pin receiving ports 32 insures proper orientation of the conductive clip for interconnection with the conductive strap 40.

Figure 7:
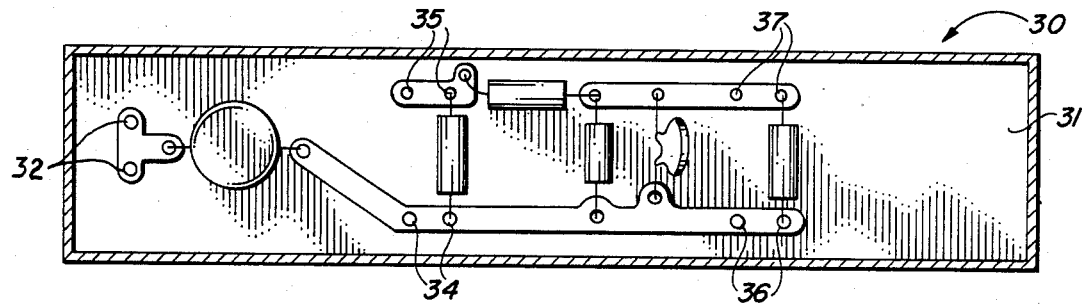
FIG. 7 is a section view 7-7 of FIG. 6 illustrating an electric circuit connected to a printed circuit board within the module of FIG. 6.
Figure 8:
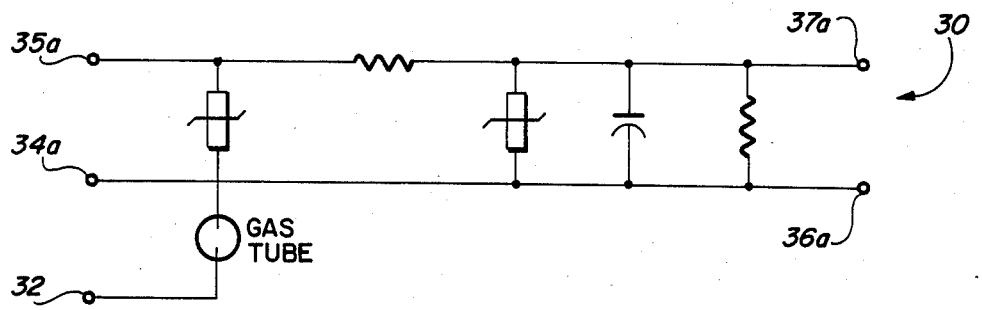
FIG. 8 is an exemplary schematic drawing of the circuit of FIG. 7.

The module 30 is capable of housing many different types of electrical circuits. FIG. 7 is a section view 7-7 of FIG. 6 illustrating an exemplary circuit on a printed circuit board (PCB) 31 which may be used in module 30. FIG. 8 illustrates a schematic diagram of the circuit in FIG. 7. While the circuit shown is a surge arrestor, the module is capable of housing other types of circuits. The clips 50 of FIG. 6 are each connected to corresponding terminals 32, 34, 35, 36 and 37 on the PCB 31. Terminals 34 and 35 act as input connections while terminals 36 and 37 act as output connections. Connecting the module 30 to a terminal connecting block effectively couples the electric circuit within the module 30 to electrical equipment connected to the terminal connecting block. Terminal 32 is positioned for alignment with ground strap 40.

Figure 9:
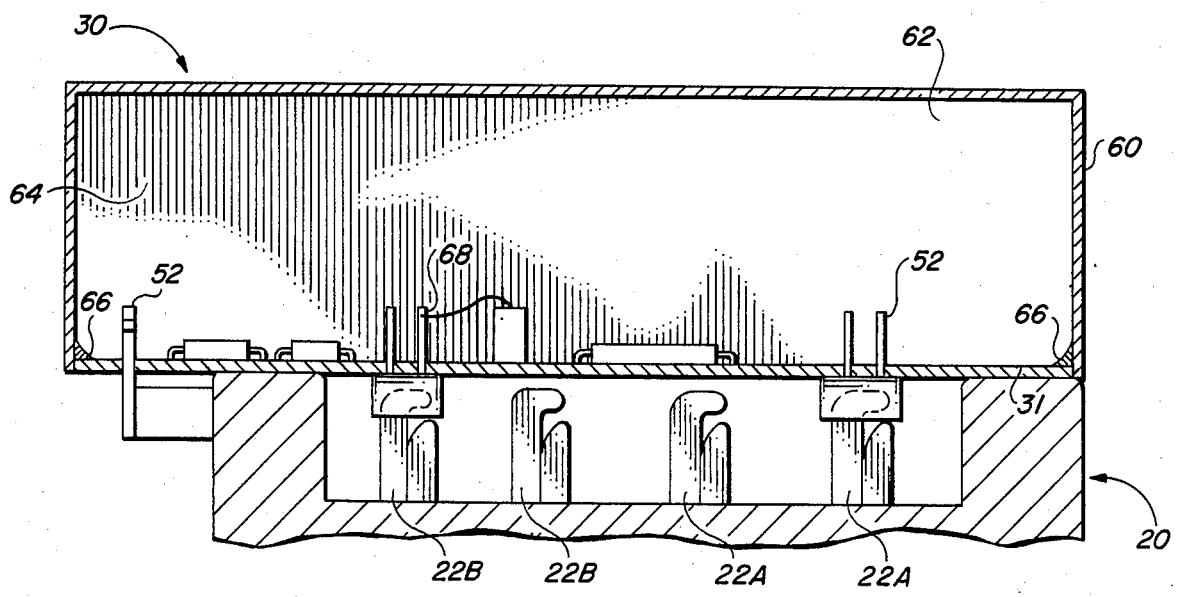
FIG. 9 is a partial cross-sectional view through an electronic module and connector block taken transverse to the direction of the grounding strap.

Referring to FIG. 9, there is shown a partial crosssectional view of a module 30 attached to a connection block 20. The clips 50 are seen to slip over and frictionally engage terminals 22. Additionally, a clip 50A slips over and grasps strap 40 to effect electrical connection thereto. The pins 52 protrude through the PCB 31 and extend into a cavity 62 within a housing 60 forming the outer shell of module 30. The cavity 62 is generally filled or partially filled with a potting compound 64, usually having an epoxy base, to provide strength and support for PCB 31 and its components. The pins 52 extend into this compound 64 and act as anchors to hold the PCB 31 in position. Initial placement of PCB 31 into housing 60 is facilitated by ledges 66 formed as part of housing 60. The ledges 66 support the PCB 31 while the compound 64 is setting.

It will be appreciated that the pins 52 may also provide additional connection points for components mounted on PCB 31 as is indicated by the connection at 68.

While the principles of the invention have now been made clear in an illustrative embodiment, it will become obvious to those skilled in the art many modifications in structure, arrangement, components, and materials used in the practice of the invention and otherwise which are particularly adapted for specific operating requirements without departing from those principles. The appended claims are therefore intended to cover and embrace any such modifications.

We claim:

1. An apparatus for grounding an electronic module electrically interconnected with a plurality of terminals extending vertically from an upper surface of a connecting block, the module having a pin receiving port for mechanically and electrically receiving a pin coupled to electrical ground, said apparatus comprising:
   (a) a substantially rigid U-shaped conductive strap having at least one end attached to a terminal connecting block, said strap extending substantially in a horizontal plane parallel to and spaced from a side of the block and having a continuous pin receiving edge lying in a plane substantially co-planar with pin receiving edges of the plurality of terminals of the block;
   (b) a clip having a protruding pin for mechanical and electrical interconnection to the pin receiving port and clip means for interconnection to said conductive strap, wherein said clip electrically interconnects said conductive strap and the electronic module; and
   (c) means for electrically coupling said conductive strap to electrical ground.

2. The apparatus of claim 1 wherein said clip means comprise a two-pronged clasp dimensioned to sandwich said conductive strap.

3. The apparatus of claim 1 wherein said conductive strap has looped ends for mechanical interconnection to the connecting block.

4. The apparatus of claim 1 wherein said means for electrically coupling said conductive strap to electrical ground comprises a compression lug on said conductive ground strap to which an electrical conductor connected to ground is attached.

5. In an electrical system having a terminal connecting block with a plurality of terminals extending vertically therefrom, an electronic module adapted for electrical interconection therewith with the electronic module having a pin receiving port for electrically connecting a conductive pin to the electronic module, and a clip having a conductive pin dimensioned for insertion into the pin receiving port and a conductive two-pronged clasp electrically coupled to the conductive pin, a conductive strap comprising;
   (a) a substantially rigid U-shaped flat conductive strip having at least one end attached to a terminal connecting block, so that the strip extends substantially in a horizontal plane parallel to and spaced from a side of the block and having a continuous pin receiving edge lying in a plane substantially co-planar with pin receiving edges of a plurality of terminals of the block; and
   (b) means on said rigid flat strip for mechanical interconnection with the connecting block.

6. The apparatus of claim 5 wherein said means on said rigid flat strip for mechanical interconnection with the connector block comprises looped ends of said rigid flat strip.

7. The apparatus of claim 5 further comprising means for coupling said conductive strap to electrical ground.

8. The apparatus of claim 7 wherein said means for coupling said conductive strap to electrical ground comprises a compression lug on said conductive strap to which an electrical conductor connected to ground is attached.

* * * * *